(12) United States Patent
Kim et al.

(10) Patent No.: US 11,688,750 B2
(45) Date of Patent: Jun. 27, 2023

(54) MODULAR FINGERPRINT RECOGNITION PACKAGE HAVING REDUCED SIZE

(71) Applicant: Samsung Electronics Co., Ltd., Suwon-si (KR)

(72) Inventors: Mi-Jin Kim, Suwon-si (KR); Seong-Jun Kim, Suwon-si (KR); Kyo-Ree Lee, Suwon-si (KR); Tae-Sang Park, Seoul (KR); Tack-Mo Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 311 days.

(21) Appl. No.: 16/650,760

(22) PCT Filed: Aug. 24, 2018

(86) PCT No.: PCT/KR2018/009804
§ 371 (c)(1),
(2) Date: Mar. 25, 2020

(87) PCT Pub. No.: WO2019/059543
PCT Pub. Date: Mar. 28, 2019

(65) Prior Publication Data
US 2020/0311376 A1    Oct. 1, 2020

(30) Foreign Application Priority Data
Sep. 25, 2017  (KR) .......................... 10-2017-0123573

(51) Int. Cl.
*H01L 27/146*    (2006.01)
*G06V 10/147*    (2022.01)
*G06V 40/13*    (2022.01)

(52) U.S. Cl.
CPC ...... *H01L 27/14618* (2013.01); *G06V 10/147* (2022.01); *G06V 40/1318* (2022.01);
(Continued)

(58) Field of Classification Search
CPC ......... H01L 27/14618; H01L 27/14623; H01L 27/14625; H01L 27/14678;
(Continued)

(56) References Cited

U.S. PATENT DOCUMENTS

| 7,227,236 B1 * | 6/2007 | Lee ................... H01L 27/14618 257/434 |
| 2010/0181090 A1 * | 7/2010 | Ogawa .............. C04B 35/63452 156/60 |

(Continued)

FOREIGN PATENT DOCUMENTS

| JP | 2008-186875 A | 8/2008 |
| JP | 2009-135263 A | 6/2009 |

(Continued)

OTHER PUBLICATIONS

International Search Report dated Feb. 25, 2019 in connection with International Patent Application No. PCT/KR2018/009804, 2 pages.
(Continued)

*Primary Examiner* — Jennifer D Bennett (57) ABSTRACT

A fingerprint recognition package may include a circuit board; an image sensor die attached and electrically connected to the circuit board; a light-shielding member applied to the circuit board; and an adhesive member attached to one side of the light-shielding member. The light-shielding member can be cured by being irradiated with ultraviolet rays, and can be thermoset by being irradiated with heat.

10 Claims, 8 Drawing Sheets

(52) U.S. Cl.
CPC .. *H01L 27/14623* (2013.01); *H01L 27/14625* (2013.01); *H01L 27/14678* (2013.01); *H01L 27/14685* (2013.01)

(58) Field of Classification Search
CPC ... H01L 27/14685; H01L 23/12; H01L 23/48; H01L 27/14683; G06V 40/13; G06V 10/147; G06V 40/1318; G06V 40/12
See application file for complete search history.

(56) References Cited

U.S. PATENT DOCUMENTS

| | | | |
|---|---|---|---|
| 2012/0049075 A1* | 3/2012 | Nariyuki | H01L 31/085 438/69 |
| 2012/0230669 A1* | 9/2012 | Abe | H01L 27/14625 264/1.7 |
| 2013/0044380 A1* | 2/2013 | Shen | G02B 7/025 359/811 |
| 2013/0045549 A1* | 2/2013 | Shiu | H01L 27/14618 257/E31.127 |
| 2016/0132712 A1 | 5/2016 | Yang et al. | |
| 2016/0224816 A1 | 8/2016 | Smith et al. | |
| 2017/0083745 A1 | 3/2017 | Goodelle et al. | |
| 2017/0220844 A1* | 8/2017 | Jones | H04N 23/54 |
| 2017/0372123 A1* | 12/2017 | Kim | G06F 3/0412 |
| 2018/0121705 A1* | 5/2018 | Oganesian | G06V 40/1318 |
| 2019/0165019 A1* | 5/2019 | Wang | H04N 5/2253 |
| 2021/0064843 A1* | 3/2021 | Ishibe | G06V 10/141 |

FOREIGN PATENT DOCUMENTS

| | | |
|---|---|---|
| KR | 10-2015-0141145 A | 12/2015 |
| KR | 10-2016-0052327 A | 5/2016 |
| KR | 10-2016-0144453 A | 12/2016 |
| KR | 10-2017-0035581 A | 3/2017 |
| WO | 2017/017553 A1 | 2/2017 |

OTHER PUBLICATIONS

Written Opinion of the International Searching Authority dated Feb. 25, 2019 in connection with International Patent Application No. PCT/KR2018/009804, 5 pages.

Decision of Grant dated Jul. 18, 2022 in connection with Korean Patent Application No. 10-2017-0123573, 6 pages.

* cited by examiner

MODULAR FINGERPRINT RECOGNITION PACKAGE HAVING REDUCED SIZE

CROSS-REFERENCE TO RELATED APPLICATIONS

This application is a 371 of International Application No. PCT/KR2018/009804 filed on Aug. 24, 2018, which claims priority to Korean Patent Application No. 10-2017-0123573 filed on Sep. 25, 2017, the disclosures of which are herein incorporated by reference in their entirety.

FIELD

Various embodiments of the disclosure relate to a fingerprint recognition package and a method of manufacturing the same.

DESCRIPTION OF THE RELATED ART

With the development of electronic technologies, various types of electronic devices are being developed and distributed. For example, the distribution of portable electronic devices such as smart phones, notebook PCs, tablet PCs, and wearable devices is being expanded.

Recently, a fingerprint recognition technology has been applied to portable electronic devices for security.

The fingerprint recognition technology is a technology mainly used to prevent various security accidents by making it necessary to perform registration and authentication procedures of a device by recognizing a user's fingerprint. In particular, the fingerprint recognition technology is applied to network defense of individuals and organizations, protection of various contents and data, secure access control, and the like. A fingerprint sensor acquires fingerprint information of a human finger, and the fingerprint sensor may include an optical fingerprint sensor.

The optical fingerprint sensor is commonly used in physical security markets such as digital door locks, and the capacitive fingerprint sensor is used in a portable electronic device due to relatively small sensor size and thickness.

Optical fingerprint sensors are being developed in the form of a package or module for application in portable electronic devices. However, since the optical fingerprint sensors are manufactured in a package form including a package substrate, a light source, and an image sensor die, the manufacturing process of products is difficult. In addition, when manufacturing an optical fingerprint sensor having this structure in the form of a package or module, there is also a difficulty in miniaturization or thinning of products.

Various embodiments of the disclosure may provide a fingerprint recognition package capable of being manufactured in the form of a package or module without a separate light source and a method of manufacturing the fingerprint recognition package.

SUMMARY

According to various embodiments of the disclosure, a fingerprint recognition package may include: a circuit board; an image sensor die attached and electrically connected to the circuit board; a light-shielding member applied to the circuit board; and an adhesive member attached to one side of the light-shielding member.

According to various embodiments of the disclosure, an electronic device including a fingerprint recognition package may include a housing on which a display is mounted and a fingerprint recognition package included in the display. The fingerprint recognition package may include a circuit board, an image sensor die mounted on and electrically connected to the circuit board and configured to detect an image of a subject through a partial area of the display, a light-shielding member applied to the circuit board, and an adhesive member attached to one side of the light-shielding member.

According to various embodiments of the disclosure, a method of manufacturing a fingerprint recognition package may include: an operation of attaching and electrically connecting an image sensor die to a circuit board; an operation of inverting the circuit board and the image sensor die and attaching a release film to face the image sensor die; an operation of applying a light-shielding member to an outer peripheral edge of the circuit board and attaching the light-shielding member to the image sensor die and the release film; an operation of irradiating the light-shielding member with ultraviolet rays so as to cure the light-shielding member; an operation of processing or removing a portion of the light-shielding member; an operation of removing the release film from the image sensor die; and an operation of attaching an adhesive member to one side of the light-shielding member.

According to various embodiments of the disclosure, a method of manufacturing a fingerprint recognition package may include: an operation of attaching and electrically connecting an image sensor die to a circuit board; an operation of inverting the circuit board and the image sensor die and attaching a release film to face the image sensor die; an operation of applying a light-shielding member to an outer peripheral edge of the circuit board and attaching the light-shielding member to the image sensor die and the release film; an operation of irradiating the light-shielding member with ultraviolet rays so as to cure the light-shielding member; an operation of removing the release film from the image sensor die; and an operation of attaching an adhesive member to one side of the light-shielding member.

According to various embodiments of the disclosure, a method of manufacturing a fingerprint recognition package may include: an operation of attaching and electrically connecting an image sensor die to a circuit board; an operation of applying a light-shielding member to an outer peripheral edge of the image sensor die; an operation of attaching a release film to face the image sensor die; an operation of seating a mask on the release film; an operation of radiating ultraviolet rays to at least one guide hole formed in the mask to make the ultraviolet rays pass through the release film so as to cure the light-shielding member; an operation of removing the release film and the mask; and an operation of attaching an adhesive member to one side of the light-shielding member.

According to various embodiments of the disclosure, a fingerprint recognition sensor is packaged without mounting a separate light source on a circuit board and manufacturing the fingerprint recognition sensor in the form of a package or module, whereby it is possible to simplify the manufacturing process of a product or to make the product thin. In addition, the image sensor die is directly mounted on the circuit board and the periphery of the image sensor die is sealed with the light-shielding member or formed with a flat face. Thus, it is easy to control and reduce the width of the flat face around the image sensor die, which makes it possible to miniaturize a modular product.

DETAILED DESCRIPTION

The embodiments and the terms used therein are not intended to limit the technology disclosed herein to specific forms, and should be understood to include various modifications, equivalents, and/or alternatives to the corresponding embodiments. In describing the drawings, similar reference numerals may be used to designate similar constituent elements. A singular expression may include a plural expression unless they are definitely different in a context. The terms "A or B", "one or more of A and/or B", "A, B, or C", or "one or more of A, B and/or C" may include all possible combinations of them. The expression "a first", "a second", "the first", or "the second" may modify corresponding elements regardless of the order or importance, and is used only to distinguish one element from another element, but does not limit the corresponding elements. When an element (e.g., first element) is referred to as being "(functionally or communicatively) connected," or "directly coupled" to another element (second element), the element may be connected directly to the another element or connected to the another element through yet another element (e.g., third element).

The term "module" as used herein may include a unit consisting of hardware, software, or firmware, and may, for example, be used interchangeably with the term "logic", "logical block", "component", "circuit", or the like. The "module" may be an integrated component, or a minimum unit for performing one or more functions or a part thereof. For example, a module may be an Application-Specific Integrated Circuit (ASIC).

An electronic device according to various embodiments disclosed herein may be any of various types of devices. The electronic device may include at least one of, for example, a portable communication device (e.g., a smart phone), a computer device, a portable multimedia device, a portable medical device, a camera, a wearable device, or a home appliance. The electronic device according to an embodiment of the disclosure is not limited to the above-mentioned devices. According to an embodiment, the front or rear side of the electronic device may include a fingerprint recognition package manufactured in the form of a package or module.

A manufacturing process of such a fingerprint recognition package will be described in more detail below.

FIGS. 1A, 1B, 1C, 1D, and 1E are views illustrating a manufacturing process of a fingerprint recognition package 100 according to various embodiments of the disclosure.

Figure 1A:
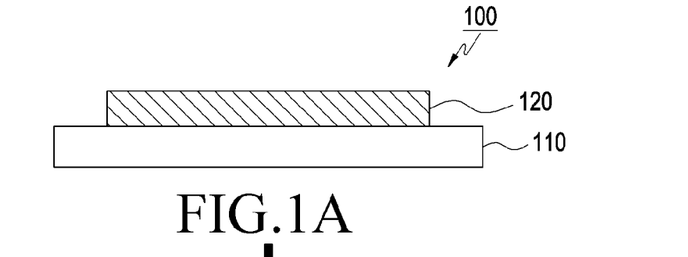
FIGS. 1A, 1B, 1C, 1D, and 1E are views illustrating a process of manufacturing a fingerprint recognition package according to various embodiments of the disclosure.

First, referring to FIG. 1A, the fingerprint recognition package 100 may include a circuit board 110, an image sensor die 120, a light-shielding member 140, and an adhesive member 150.

A release film 130 may be attached onto the image sensor die 120 in a predetermined section of the manufacturing process of the fingerprint recognition package 100.

The image sensor die 120 may be attached to the circuit board 110, and the circuit board 110 may be electrically connected to the image sensor die 120. The circuit board 110 and the image sensor die 120 may be electrically connected to each other through wire bonding (e.g., 704 in FIG. 7). In this case, a light source is not mounted on the circuit board 110.

The circuit board 110 may include a single-sided PCB or a double-sided PCB, and may include a multi-layer PCB including one or more internal wiring patterns inside the board 110. In addition, the circuit board 110 may include a rigid printed circuit board (rigid-PCB) or a flexible printed circuit board (flexible-PCB).

The image sensor die 120 may include, for example, a semiconductor device (or a semiconductor chip) that receives optical information and converts the optical information into an electrical signal. For example, the image sensor die 120 may detect and convert the image information of a subject (e.g., a subject including information on user authentication, such as a fingerprint) into an electrical signal.

Figure 1B:
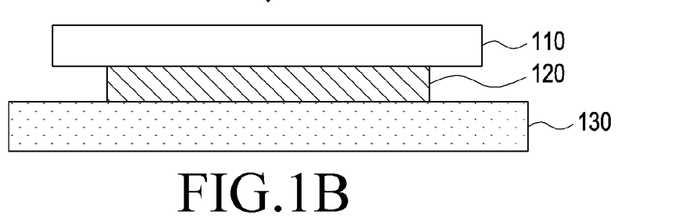

As in FIG. 1B, the circuit board 110 and the image sensor die 120 are inverted. In the state in which the circuit board 110 and the image sensor die 120 are inverted as described above, the release film 130 may be attached to face the image sensor die 120.

The release film 130 may refer to a film obtained by coating one side or both sides of a polyester film PTE with a silicon composition added with inorganic particles exhibiting an antistatic effect to ensure uniform running and good adhesion efficiency. For example, the release film 130 may be used to protect adhesive layers of an electronic device, an electronic component, and a display material due to the excellent peeling force, residual adhesive strength, and antistatic performance.

The release film 130 may include at least one of a transparent film, a translucent film, or glass. The release film 130 will be described using, for example, a transparent film, a translucent film, or glass, but is not limited thereto. For example, the release film 130 may be variously applied as long as it is a film having uniform adhesiveness. Various embodiments of the disclosure will be described with the application of a release film 130 including a transparent film.

Figure 1C:
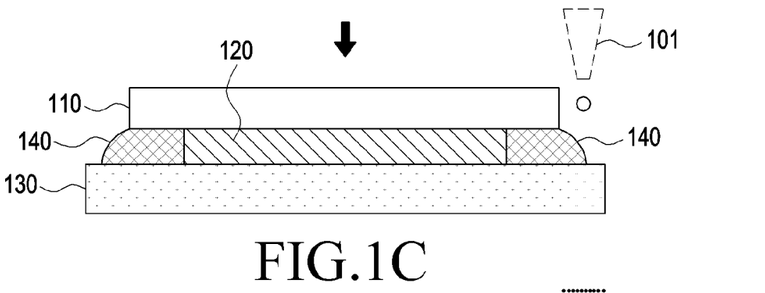

As in FIG. 1C, the light-shielding member 140 may be applied to the circuit board 110 using an application device 101. The light-shielding member 140 may be attached to the image sensor die 120 and the release film 130. The light-shielding member 140 may be applied along the outer peripheral edge of the circuit board 110. The light-shielding member 140 may seal the periphery of the image sensor die 120 or wire bonding (e.g., 704 in FIG. 7) except for the top side of the image sensor die 120. For example, the light-shielding member 140 may seal the periphery of the image sensor die 120 or wire bonding (e.g., 704 in FIG. 7) except for the top side of the image sensor die 120 so as to block light entering the periphery or wire bonding (e.g., 704 in FIG. 7) except for the top side of the image sensor die 120. For example, since the release film 130 is in the state of being attached to face the image sensor die 120, the light-shielding member 140 may be applied to the periphery of the image sensor die 120 except for the top side of the image sensor die 120 and may block the light entering the image sensor die 140 from the lateral side of the image sensor die 140 rather than the top side of the image sensor die 140. In addition, the light-shielding member 140 may bury the wire bonding (e.g., 704 in FIG. 7) that electrically interconnects the image sensor die 120 and the circuit board 110 so as to protect the wire bonding from the external environment. In this case, the light-shielding member 140 may be applied to the circuit board 110 in the state in which no separate light source is included in the circuit board 110.

According to an embodiment, the light-shielding member 140 may be formed of various materials in consideration of heat transfer, dustproof/moisture proof performance, flexibility, tensile strength, thermal conductivity efficiency, and adhesiveness. The light-shielding member 140 may be formed of, for example, a silicon-based material, a thermosetting material, or an ultraviolet curable material including a photo initiator. In addition, the light-shielding member 140 may be formed of a polymer such as resin. For example, the light-shielding member may include at least one of an ultraviolet-curable polymer or a thermosetting resin.

According to an embodiment, the light-shielding member 140 may block 90% of light in a wavelength range of 400 to 700 nm.

In this state, the light-shielding member 140 may be cured by being irradiated with ultraviolet (UV) rays. Alternatively, the light-shielding member 140 may be cured by being irradiated with heat. UV-curing and thermosetting may be performed together on the light-shielding member 140. In this way, the light-shielding member 140 may be cured by being irradiated with ultraviolet rays by an ultraviolet irradiation device 101.

Figure 1D:
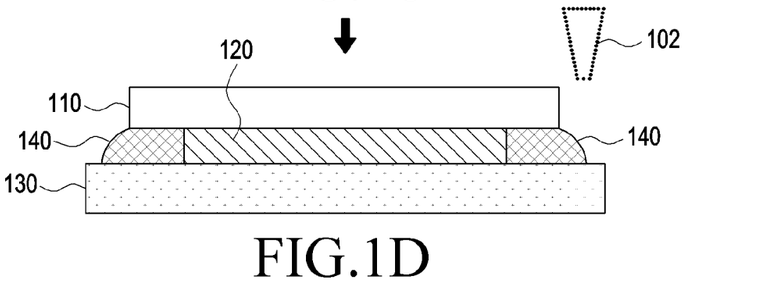

The light-shielding member 140 is cured by being irradiated ultraviolet rays, and as in FIG. 1D, the light-shielding member 140 may be processed by a dimension processing device 102 depending on the outer dimensions of the fingerprint recognition package 100.

The dimension processing device may include at least one of a laser device (not illustrated) or a router (not illustrated). The laser device may process the dimensions of the light-shielding member by etching the light-shielding member 140 simultaneously shooting laser beams to the light-shielding member 140. The router refers to a hand-held power tool that uses bits that rotate to grind molding or to machine a connection portion between grooves. Therefore, the router may process the dimensions of the light-shielding member 140 using the rotating bit.

The dimensions of the light-shielding member 140 may be processed using a laser or a router to match the outer dimensions of the fingerprint recognition package 100 in the X-axis and Y-axis directions.

As in FIG. 1D, the release film 130 may be removed from the image sensor die 120 and the light-shielding member 140. As in FIG. 1E, an adhesive member 150 may be attached to one side of the light-shielding member 140 from which the release film 130 is removed. The adhesive member 150 may include at least one of cohesion material or adhesive. The adhesive may include at least one of double sided tape and gel. In addition, the adhesive member may include at least one of urethane, acryl, or silicon. The adhesive member is described with reference to urethane, acryl, or silicon as an example, but is not limited thereto. For example, the adhesive member may be variously applied as long as it is adhesive that attaches the light-shielding member.

The image sensor die 120 may include an optical layer (e.g., 705 in FIG. 7) on one side thereof.

As described above, since the fingerprint recognition package is manufactured in the form of a module as described above, it is possible to simplify the structure of a product to simplify the production thereof and to reduce the thickness of the product to make the product slim. In addition, since the image sensor die is directly mounted on the circuit board and the periphery of the image sensor die is sealed with the light-shielding member or formed with a flat face, it is easy to control and reduce the width of the flat face around the image sensor die, which makes it possible to miniaturize a modular product.

Figure 1E:
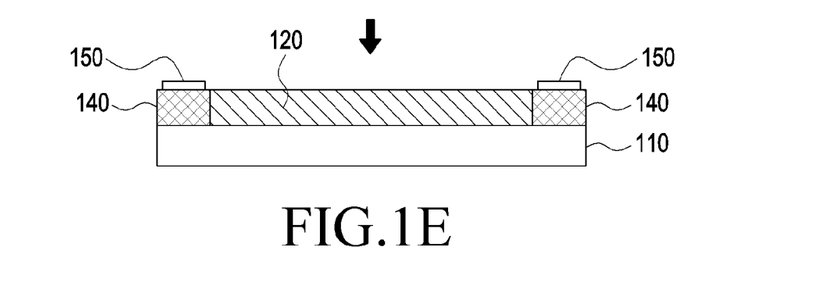
Figure 7:
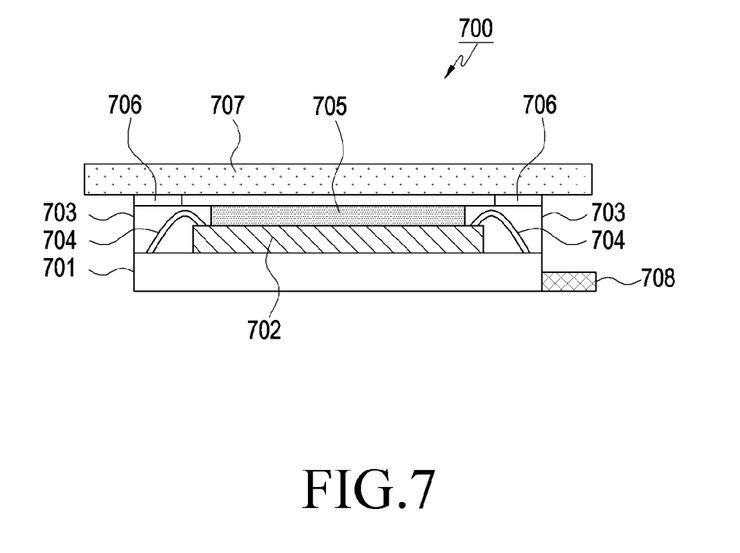
FIG. 7 is a vertical cross-sectional view illustrating the state in which a fingerprint recognition package according to various embodiments of the disclosure is attached to the rear side of a window of an electronic device.

According to an embodiment, in the fingerprint recognition package 100, the image sensor die 120 is attached to the top side of the circuit board 110, and the circuit board 110 and the image sensor die 120 are electrically connected through wire bonding (e.g., 701 in FIG. 7). On the circuit board 110, the light-shielding member 140 may be applied to the periphery of the light-shielding member 110 or the wire bonding (e.g., 704 in FIG. 7) except for the top side of the image sensor die 120 in order to block light. The adhesive member 150 may be attached to the top side of the light-shielding member 140 so as to be attached to the display (e.g., 707 in FIG. 7) of an electronic device (not illustrated), and an optical layer (e.g., 705 in FIG. 7) may be attached to the top side of the light-shielding member 140. For example, light emitted from a display (e.g., 707 in FIG. 7) of an electronic device (not illustrated) may be reflected by a user fingerprint, the image of the reflected user fingerprint may be transmitted to the image sensor die (e.g., 702 in FIG. 7) through the optical layer, and the image sensor die 120 may detect the transmitted image of the user fingerprint.

The fingerprint recognition package 100 manufactured as described above may be disposed on the rear side of a display (e.g., 707 in FIG. 7) of an electronic device (not illustrated). In this case, the fingerprint recognition package 100 may be attached to the rear side of the display (e.g., 707 in FIG. 7) using the adhesive member 150.

According to an embodiment, the fingerprint recognition package 100 may be provided with a flexible printed circuit board (flexible-PCB) electrically connected to a connection member (not illustrated) included in an electronic device (not illustrated). For example, the fingerprint recognition package 100 may be connected to a main board (not illustrated) of an electronic device (not illustrated) through the flexible printed circuit board (flexible-PCB).

According to an embodiment, the fingerprint recognition package 100 may use a light source emitted from the display of the electronic device without mounting a separate light source on the circuit board 110. The light emitted from the display (e.g., 707 in FIG. 7) of the electronic device (not illustrated) is reflected by the user fingerprint, and the reflected image of the user fingerprint may be detected by the image sensor die (e.g., 702 in FIG. 7).

According to an embodiment, the fingerprint recognition package 100 may include an image sensor die 120 that acquires fingerprint information while the finger is sliding on a sensing face. For example, the image sensor die 120 may detect and convert the image information of a subject (e.g., a subject including information on user authentication, such as a fingerprint) into an electrical signal.

Figure 8:
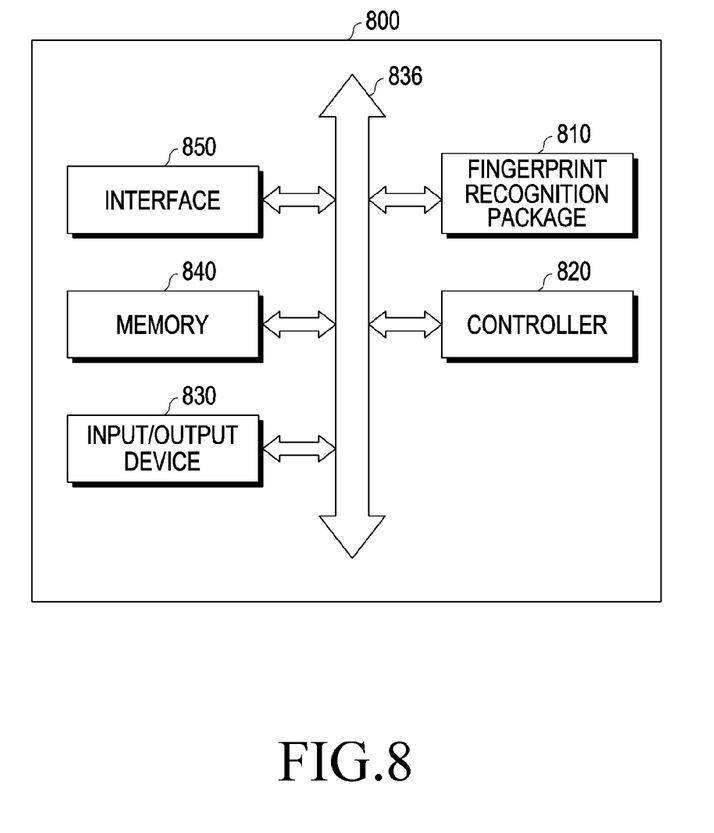
FIG. 8 is a block diagram schematically illustrating a fingerprint recognition system including a fingerprint recognition package according to various embodiments of the disclosure.

According to an embodiment, a controller (e.g., 820 in FIG. 8) may receive the fingerprint information acquired by the fingerprint recognition package 810 and may store the fingerprint information in memory (e.g., 840 in FIG. 8). The previously registered user fingerprint information and the acquired fingerprint information may be compared so as to determine whether the previously registered user fingerprint information and the acquired fingerprint information match.

Figure 2:
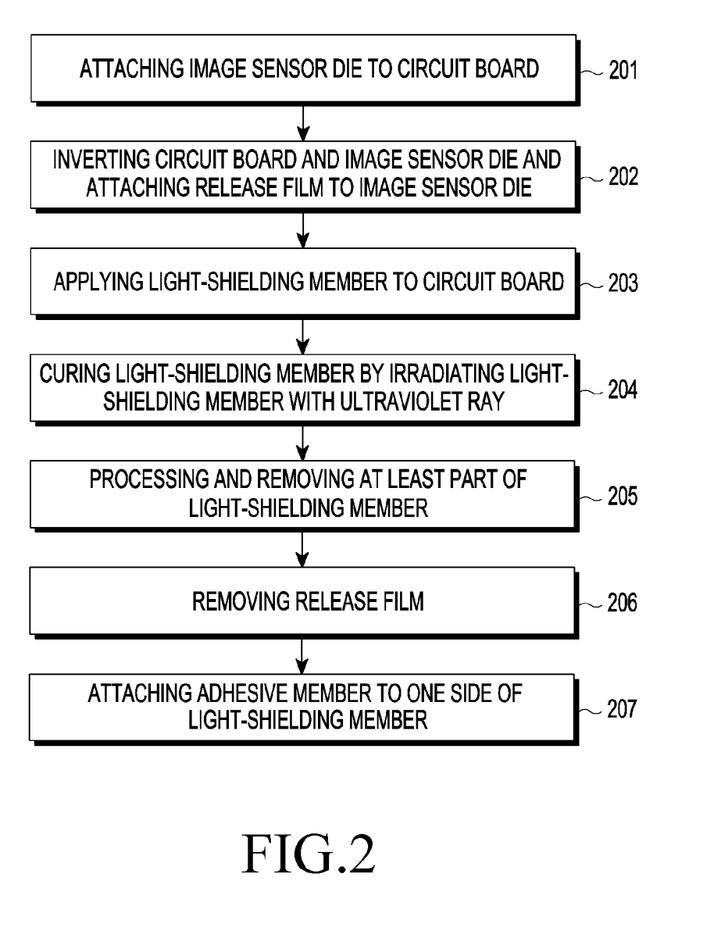
FIG. 2 is a flowchart illustrating a method of manufacturing a fingerprint recognition package according to various embodiments of the disclosure.

FIG. 2 is a flowchart illustrating a method of manufacturing a fingerprint recognition package (e.g., 100 in FIG. 1) according to various embodiments of the disclosure.

Referring to FIG. 2, in the method of manufacturing a fingerprint recognition package (e.g., 100 in FIG. 1), first, an image sensor die (e.g., 120 of FIG. 1) is attached to a circuit board (e.g., 110 in FIG. 1) (201), and the circuit board (e.g., 110 in FIG. 1) and the image sensor die (e.g., 120 in FIG. 1) may be electrically connected to each other through wire bonding (e.g., 704 in FIG. 7).

The circuit board (e.g., 110 in FIG. 1) and the image sensor die (e.g., 120 in FIG. 1) may be inverted, and a release film (e.g., 130 in FIG. 1) may be attached to face the bottom side of the image sensor die (e.g., 120 in FIG. 1) (202).

The circuit board (e.g., 110 in FIG. 1) may be disposed on the top side of the image sensor die (e.g., 120 in FIG. 1).

In this state, a light-shielding member (e.g., 140 in FIG. 1) may be applied to the outer edge of the circuit board (e.g., 110 in FIG. 1) by an application device (e.g., 101 of FIG. 1) (203), and the light-shielding member (e.g., 140 in FIG. 1) may attach the image sensor die (e.g., 120 in FIG. 1) and the release film (e.g., 130 in FIG. 1).

The light-shielding member (e.g., 140 in FIG. 1) may be cured by being irradiated with ultraviolet rays by an ultraviolet irradiation device (e.g., 102 in FIG. 1) (204).

After UV-curing the light-shielding member (e.g., 140 in FIG. 1), the light-shielding member (e.g., 140 in FIG. 1) may be processed or removed depending on the outer dimensions of the fingerprint recognition package (e.g., 100 in FIG. 1) using a dimension processing device (205). The dimension processing device may include at least one of a laser device or a router.

The light-shielding member (e.g., 140 in FIG. 1) may be processed or removed using a laser or a router to match the outer dimensions of the fingerprint recognition package (e.g., 100 in FIG. 1) of the X-axis and Y-axis directions.

The release film (e.g., 130 in FIG. 1) may be removed from the image sensor die (e.g., 120 in FIG. 1) (206).

An adhesive member (e.g., 150 in FIG. 1) may be attached to one side of the light-shielding member (e.g., 140 in FIG. 1) so as to attach the light-shielding member (e.g., 110 in FIG. 1) to the display of the electronic device (207). The adhesive member (e.g., 150 in FIG. 1) may include at least one of cohesion material or adhesive. The adhesive may include at least one of double sided tape and gel.

The image sensor die (e.g., 120 in FIG. 1) may include an optical layer (e.g., 705 in FIG. 7) on one side thereof.

The fingerprint recognition package (e.g., 100 in FIG. 1) manufactured as described above may be attached to the rear side of the display (e.g., 107 in FIG. 7) of the electronic device (not illustrated) using the adhesive member (e.g., 150 in FIG. 1). Accordingly, the fingerprint recognition package (e.g., 100 in FIG. 1) may be disposed on the rear side of the display of the electronic device (not illustrated).

FIGS. 3A, 3B, 3C, and 3D are views illustrating a manufacturing process of a fingerprint recognition package 300 according to other various embodiments of the disclosure.

Figure 3A:
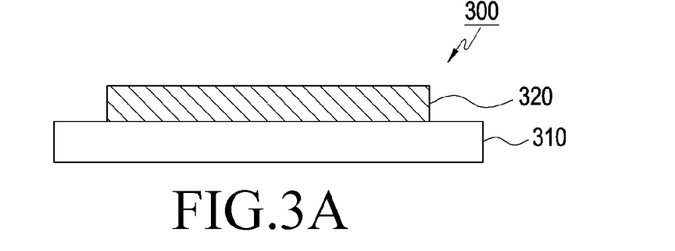
FIGS. 3A, 3B, 3C, and 3D are views illustrating a process of manufacturing a fingerprint recognition package according to other various embodiments of the disclosure.

First, referring to FIG. 3A, the fingerprint recognition package 300 may include a circuit board 310, an image sensor die 320, a light-shielding member 340, and an adhesive member 350.

In this disclosure, a release film 330 may be attached onto the image sensor die 320 in a predetermined section of the manufacturing process of the fingerprint recognition package 300. According to an embodiment, the circuit board 310 may be included in at least a part of a printed circuit unit (not illustrated) included in, for example, an electronic device (not illustrated).

The image sensor die 320 may be attached to the circuit board 310, and the circuit board 310 may be electrically connected to the image sensor die 320. The circuit board 310 and the image sensor die 320 may be electrically connected to each other through wire bonding (e.g., 704 in FIG. 7).

Figure 3B:
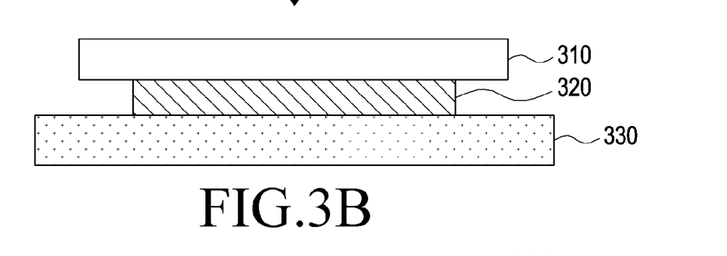

As in FIG. 3B, the circuit board 510 and the image sensor die 320 are inverted. In the state in which the circuit board 310 and the image sensor die 320 are inverted as described above, a release film 530 may be attached to the image sensor die 320.

Figure 3C:
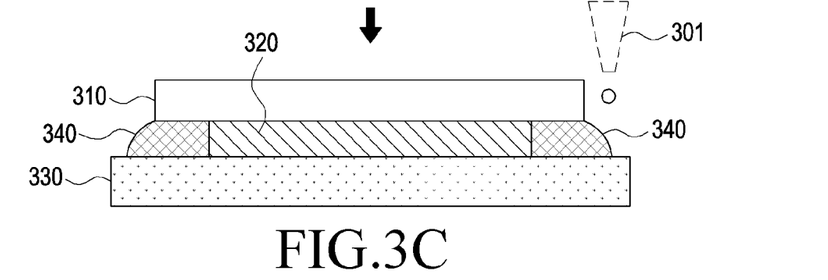

As in FIG. 3C, a light-shielding member 340 may be applied to the circuit board 310 using an application device 301. In this case, the light-shielding member 340 may be applied to the circuit board 310, which does not include a separate light source.

The light-shielding member 340 may be attached to the image sensor die 320 and the release film 330. The light-shielding member 340 may be applied to the peripheral edge of the circuit board 310. The light-shielding member 340 may seal the periphery of the image sensor die 320 or wire bonding except for the top side of the image sensor die 320 so as to block light entering the periphery or wire bonding except for the top side of the image sensor die 320.

The light-shielding member 340 may be cured by being irradiated with ultraviolet rays. In addition, the light-shielding member 340 may be thermoset by being irradiated with heat. In addition, UV-curing and thermosetting may be performed together on the light-shielding member 340. The embodiment will be described with the application of an embodiment in which the light-shielding member 340 is cured being irradiated with UV rays.

Figure 3D:
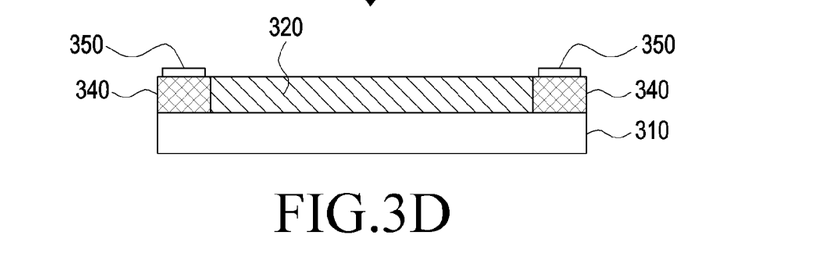

In this state, as in FIG. 3D, the release film 530 may be removed from the image sensor die 320 and the light-shielding member 340, and an adhesive member 350 may be attached to one side of the light-shielding member 340 from which the release film 330 is removed. The adhesive member 350 may include at least one of cohesion material and adhesive.

The image sensor die 320 may include an optical layer on one side thereof. The fingerprint recognition package 300 manufactured as described above may be manufactured in the form of a package or module by omitting the process of processing and removing the light-shielding member 340. As a result, the fingerprint recognition package 300 may further simplify the manufacturing process in the form of a package or the module.

The fingerprint recognition package 300 manufactured as described above may be disposed on the rear side of a display (e.g., 1007 in FIG. 7) of the electronic device (not illustrated). For example, the fingerprint recognition package 300 may be attached to the rear side of the display (e.g., 707 in FIG. 7) using the adhesive member 350.

Figure 4:
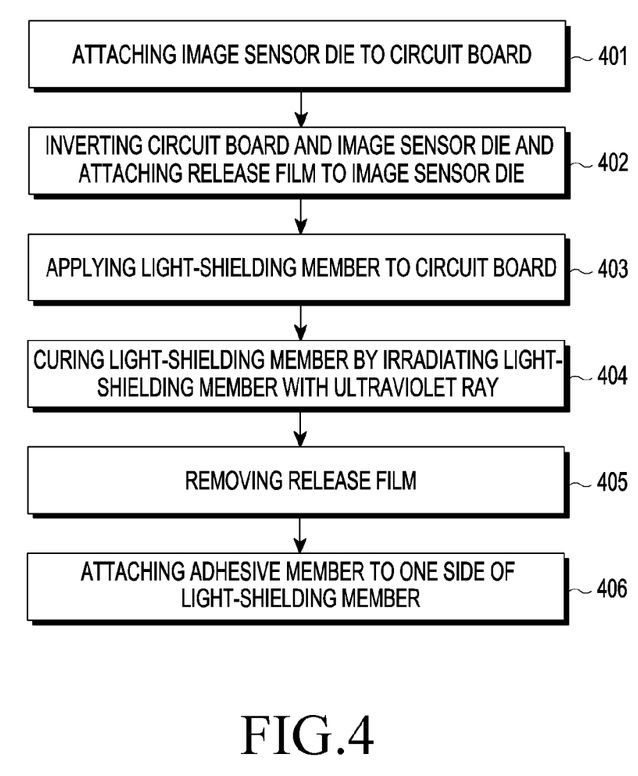
FIG. 4 is a flowchart illustrating a method of manufacturing a fingerprint recognition package according to other various embodiments of the disclosure.

FIG. 4 is a flowchart illustrating a method of manufacturing a fingerprint recognition package according to other various embodiments of the disclosure.

Referring to FIG. 4, in the method of manufacturing a fingerprint recognition package (e.g., 300 in FIG. 3), first, an image sensor die (e.g., 320 of FIG. 3) is attached to a circuit board (e.g., 310 in FIG. 3) (401), and the circuit board (e.g., 310 in FIG. 3) and the image sensor die (e.g., 320 in FIG. 3) may be electrically connected to each other. The circuit board (e.g., 310 in FIG. 3) and the image sensor die (e.g., 320 in FIG. 3) may be electrically connected to each other through wire bonding (e.g., 704 in FIG. 7).

The circuit board (e.g., 310 in FIG. 3) and the image sensor die (e.g., 320 in FIG. 3) are inverted. In this state, a release film (e.g., 330 in FIG. 3) may be attached to face the image sensor die (e.g., 320 in FIG. 3) (402).

A light-shielding member (e.g., 310 in FIG. 3) may be applied to the circuit board (e.g., 310 in FIG. 3) by an application device (e.g., 301 in FIG. 3) (403). The light-shielding member (e.g., 340 in FIG. 3) may be attached to the image sensor die (e.g., 320 in FIG. 3) and the release film (e.g., 330 in FIG. 3). The light-shielding member (e.g., 340 in FIG. 3) may be applied along the outer peripheral edge of the circuit board (e.g., 310 in FIG. 3). The light-shielding member (e.g., 340 in FIG. 3) may seal the periphery of the image sensor die (e.g., 320 in FIG. 3) or wire bonding (e.g., 704 in FIG. 7) except for the top side of the image sensor die 120.

The light-shielding member (e.g., 340 in FIG. 3) may be cured by being irradiated with ultraviolet rays (404).

In this state, the release film (e.g., 330 in FIG. 3) may be removed from the image sensor die (e.g., 320 in FIG. 3) and the light-shielding member (e.g., 340 in FIG. 3). On one side of the light-shielding member (e.g., 340 in FIG. 3), an adhesive member (e.g., 330 in FIG. 3) may be included so as to attach the light-shielding member to the display (e.g., 707 in FIG. 7) of the electronic device (406).

The fingerprint recognition package (e.g., 300 in FIG. 3) manufactured as described above may be disposed on the rear side of the display (e.g., 1007 in FIG. 7) of the electronic device (not illustrated). For example, the fingerprint recognition package 300 may be attached to the rear side of the display (e.g., 707 in FIG. 7) using the adhesive member 350.

The image sensor die (e.g., 320 in FIG. 3) may include an optical layer (e.g., 705 in FIG. 7) on one side thereof. The fingerprint recognition package (e.g., 300 in FIG. 3) manufactured as described above may make it easy to manufacture a product in the form of a package or module by omitting the process of processing and removing the light-shielding member 340. In addition, the fingerprint recognition package 300 may further simplify the manufacturing process in the form of a package or the module.

FIGS. 5A, 5B, 5C, 5D, and 5E are views illustrating a manufacturing process of a fingerprint recognition package 500 according to other various embodiments of the disclosure.

Figure 5A:
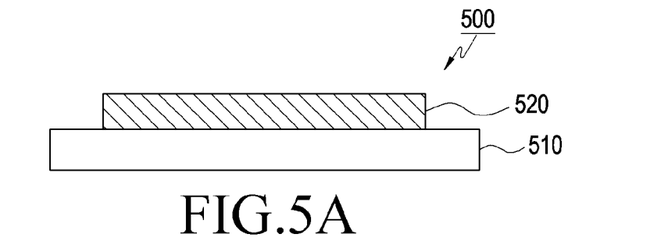
FIGS. 5A, 5B, 5C, 5D, and 5E are views illustrating a process of manufacturing a fingerprint recognition package according to still other various embodiments of the disclosure.

First, referring to FIG. 5A, the fingerprint recognition package 500 may include a circuit board 510, an image sensor die 520, a light-shielding member 530, and an adhesive member 560.

A release film 540 and a mask 550 may be temporarily attached onto the image sensor die 520 in a predetermined section of the manufacturing process of the fingerprint recognition package 500.

The image sensor die 520 may be attached to the circuit board 510, and the circuit board 510 may be electrically connected to the image sensor die 520. The circuit board 510 and the image sensor die 520 may be electrically connected to each other through wire bonding (e.g., 704 in FIG. 7). No separate light source is mounted on the circuit board 510. For example, the fingerprint recognition package 500 may use a light source emitted from the display (e.g., 707 in FIG. 7) of the electronic device (not illustrated) without mounting a separate light source on the circuit board 510. The light emitted from the display (e.g., 707 in FIG. 7) of the electronic device (not illustrated) is reflected by the user fingerprint, and the reflected image of the user fingerprint may be detected by the image sensor die (e.g., 702 in FIG. 7).

Figure 5B:
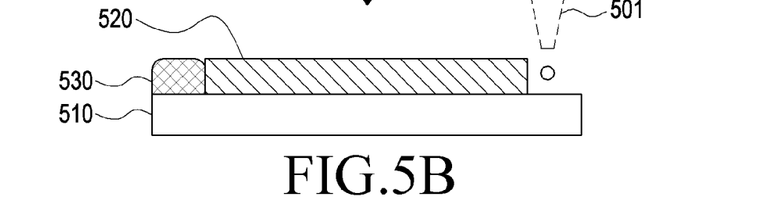

As in FIG. 5B, the light-shielding member 530 may be applied to the outer peripheral edge of the image sensor die 520 using an application device 501.

The light-shielding member 530 may be attached to the image sensor die 520, and may also be applied along the outer peripheral edge of the circuit board 510 on which no light source is mounted. The light-shielding member 530 may seal the periphery of the image sensor die 520 or wire bonding except for the top side of the image sensor die 520. For example, the light-shielding member 530 may seal the periphery of the image sensor die 520 or wire bonding except for the top side of the image sensor die 520 so as to block light entering the periphery or wire bonding except for the top side of the image sensor die 520. For example, since the release film 540 is in the state of being attached to face the image sensor die 520, the light-shielding member 530 may be applied to the periphery of the image sensor die 520 except for the top side of the image sensor die 520 and may block the light entering the image sensor die 520 from the lateral side of the image sensor die 520 rather than the top side of the image sensor die 520. The light-shielding member 530 may bury the wire bonding (e.g., 704 in FIG. 7) that electrically interconnects the image sensor die 520 and the circuit board 510 so as to protect the wire bonding from the external environment.

Figure 5C:
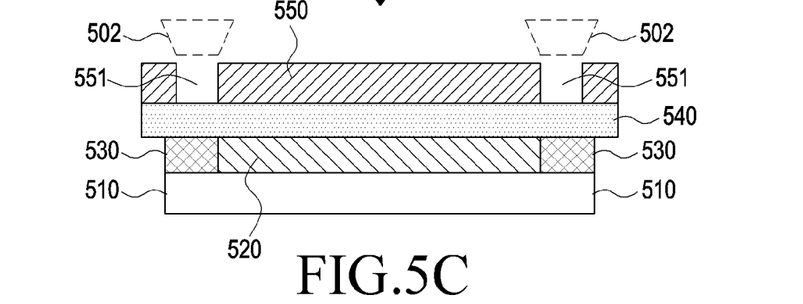

As in FIG. 5C, the release film 540 may be attached to face one side of the image sensor die 520, and the mask 550 may be mounted on one side of the release film 540.

In this state, at least one guide hole 551 formed in the mask 550 may be irradiated with ultraviolet rays. For example, the ultraviolet irradiation device 502 may be moved to the at least one guide hole 551, and in the state in which the ultraviolet irradiation device 502 and the at least one guide hole 551 face each other, the ultraviolet rays of the ultraviolet irradiation device 502 may be radiated to the at least one guide hole 551. In this case, the ultraviolet rays radiated through the at least one guide hole 551 may pass through the release film 540 so as to cure the light-shielding member 530. The release film 540 may include a transparent film so as to transmit ultraviolet rays.

Figure 5D:
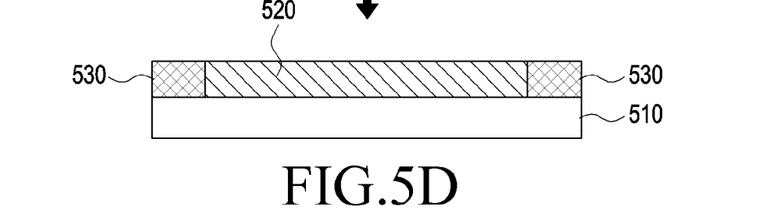

As in FIG. 5D, the image sensor die 520 and the light-shielding member 530 may be cleaned in the state in which the release film 540 and the mask 550 are released from the image sensor die 520 and the light-shielding member 530.

Figure 5E:
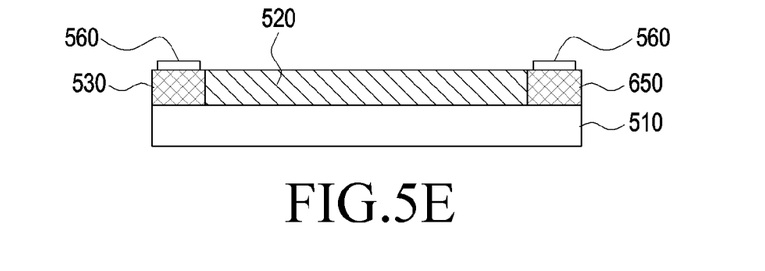

As in FIG. 5E, an adhesive member 560 may be attached to one side of the light-shielding member 530 from which the release film 540 and the mask 550 are removed.

The image sensor die 520 may include an optical layer (e.g., 1005 in FIG. 7) on one side thereof. In this way, it is possible to manufacture the fingerprint recognition package 500.

In the fingerprint recognition package 500 according to other various embodiments of the disclosure, the light-shielding member 530 may be directly applied to the image sensor die 520 without inverting the circuit board 510 having no light source and the image sensor die 520. In this state, the release film 540 and the mask 550 may be attached, and ultraviolet rays may be radiated onto the release film 540 through at least one guide hole 551 in the mask 550. The radiated ultraviolet rays may pass through the release film 540 so as to cure the light-shielding member 530. The light-shielding member 530 may be UV-cured, and the release film 540 and the mask 550 may be removed or cleaned. In this case, depending on the type of the light-shielding member 530, thermosetting may be additionally performed on the fingerprint recognition package 500 so as to completely cure the light-shielding member 530.

Figure 6:
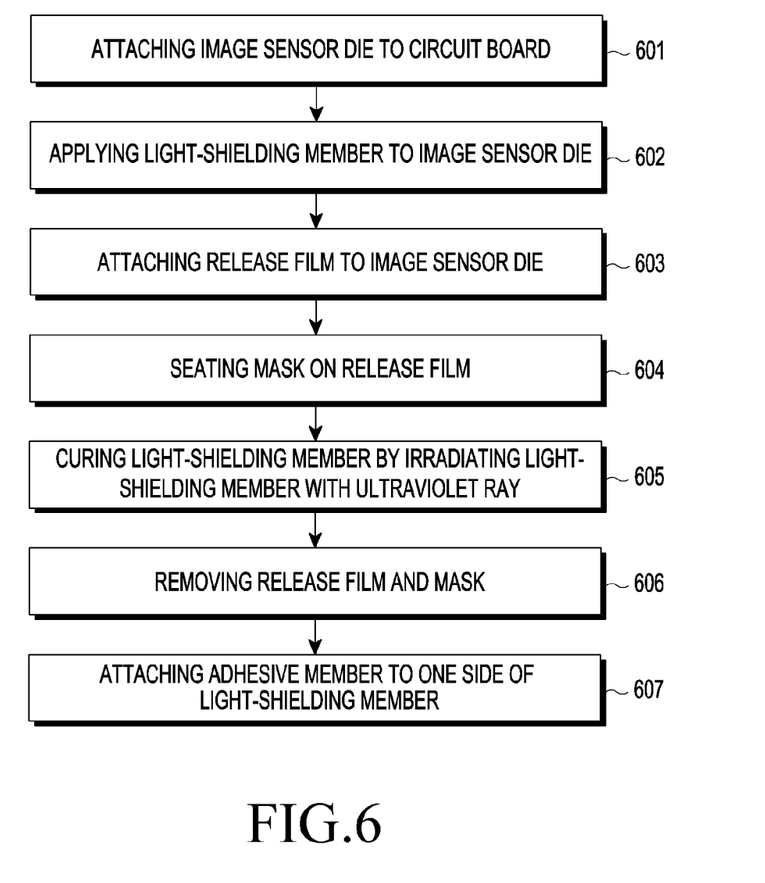
FIG. 6 is a flowchart illustrating a method of manufacturing a fingerprint recognition package according to still other various embodiments of the disclosure.

FIG. 6 is a flowchart illustrating a method of manufacturing a fingerprint recognition package according to still other various embodiments of the disclosure.

Referring to FIG. 6, in the method of manufacturing a fingerprint recognition package (e.g., 500 in FIG. 5), first, an image sensor die (e.g., 520 in FIG. 5) is attached to a circuit board (e.g., 510 in FIG. 5) having no light source (601), and the circuit board (e.g., 510 in FIG. 5) and the image sensor die (e.g., 520 in FIG. 5) may be electrically connected to each other through wire bonding (e.g., 704 in FIG. 7).

In this state, a light-shielding member (e.g., 530 in FIG. 5) may be applied to the image sensor die (e.g., 520 in FIG. 5) by an application device (e.g., 501 in FIG. 5) (602).

A release film (e.g., 540 in FIG. 5) may be attached to face one side of the image sensor die (e.g., 520 in FIG. 5) (603).

A mask (e.g., 550 in FIG. 5) may be seated on the release film (e.g., 540 in FIG. 5) (604), and at least one guide hole (e.g., 551 in FIG. 5) may be formed in the mask (e.g., 550 in FIG. 5).

Ultraviolet rays of an ultraviolet irradiation device (e.g., 502 in FIG. 5) may be radiated to the at least one guide hole (e.g., 551 in FIG. 5). The radiated ultraviolet rays may pass through the release film (e.g., 540 in FIG. 5) so as to cure the light-shielding member (e.g., 530 in FIG. 5).

The release film (e.g., 540 in FIG. 5) may include at least one of a transparent film, a translucent film, or glass. In this embodiment, the release film (e.g., 540 in FIG. 5) may include a transparent film so as to transmit ultraviolet rays.

The release film (e.g., 540 in FIG. 5) or the mask (e.g., 550 in FIG. 5) may be removed from the image sensor die (e.g., 520 in FIG. 5) and the light-shielding member (e.g., 530 in FIG. 5) (606).

An adhesive member (e.g., 560 in FIG. 5) may be attached to one side of the light-shielding member (e.g., 530 in FIG. 5) (607).

The fingerprint recognition package (e.g., 500 in FIG. 5) manufactured as described above may be disposed on the rear side of the display (e.g., 707 in FIG. 7) of the electronic device (not illustrated) using the adhesive member (e.g., 560 in FIG. 5).

FIG. 7 is a vertical cross-sectional view illustrating the state in which a fingerprint recognition package 700 according to various embodiments of the disclosure is applied to an electronic device.

Referring to FIG. 7, in the fingerprint recognition package 700, an image sensor die 702 is attached to the top side of a circuit board 701, and the circuit board 701 and the image sensor die 702 are electrically connected through wire bonding 704. On the circuit board 701, a light-shielding member 703 may be applied to the periphery of the light-shielding member 703 or the wire bonding 704 except for the top side of the image sensor die 702 in order to block light, and an adhesive member 706 may be attached to the top side of the light-shielding member 703. An optical layer 705 may be attached to the top side of the image sensor die 702.

The fingerprint recognition package 700 may be disposed on the rear side of a display 707 of an electronic device (not illustrated). For example, the fingerprint recognition package 700 may be attached to the rear side of the display 707 using an adhesive member 706.

According to an embodiment, the fingerprint recognition package 700 may be provided with a flexible printed circuit board (flexible-PCB) 708 electrically connected to a connection member (not illustrated) included in an electronic device (not illustrated). For example, the fingerprint recognition package 700 may be electrically connected to a main board (not illustrated) of the electronic device (not illustrated) via the flexible printed circuit board (flexible-PCB) 708, and may be mounted within the electronic device (not illustrated).

FIG. 8 is a block diagram schematically illustrating a fingerprint recognition system including a fingerprint recognition package 810 according to various embodiments of the disclosure.

Referring to FIG. 8, a fingerprint recognition system 800 may include a fingerprint recognition package 810, a controller 820, an input/output device 830, memory 840, and an interface 850. The fingerprint recognition package 810, the controller 820, the input/output device 830, the memory 840, and the interface 850 may communicate with each other via a bus 836.

The fingerprint recognition system 800 may be a system for acquiring fingerprint information having a unique characteristic difference for each user, and comparing the acquired fingerprint information with user information registered in advance in a library so as to determine whether or not the user is the true user.

The fingerprint recognition package 810 may acquire user fingerprint information. For example, the fingerprint recognition package 810 may use a light source emitted from the display (e.g., 707 in FIG. 7) of the electronic device (not illustrated) without mounting a separate light source on the circuit board. The light emitted from the display (e.g., 707 in FIG. 7) of the electronic device (not illustrated) is reflected by the user fingerprint, and the reflected image of the user fingerprint may be detected by the image sensor die (e.g., 702 in FIG. 7).

The fingerprint recognition package 810 may include an image sensor die (e.g., 702 in FIG. 7) that acquires fingerprint information while the finger is sliding on a sensing face. For example, the image sensor die (e.g., 702 in FIG. 7) may detect and convert the image information of a subject (e.g., a subject including information on user authentication, such as a fingerprint) into an electrical signal.

The controller 820 may serve to control the fingerprint recognition system 800. The controller 820 may receive the fingerprint information acquired by the fingerprint recognition package 810 and may store the fingerprint information in the memory 840. The controller 820 may compare the previously registered user fingerprint information with the acquired fingerprint information so as to determine whether they match. The controller 820 may include at least one of, for example, at least one microprocessor, a digital signal processor, a microcontroller, and logic elements capable of performing functions similar to those of these components.

The input/output device 830 may be used to input or output data of the fingerprint recognition system 800. The input/output device 830 may include at least one selected from, for example, a keypad, a keyboard, a display device, or the like.

The memory 840 may store codes and/or data for the operation of the controller 820, and/or may store data processed by the controller 820. The memory 840 may include a volatile memory device such as a DRAM and/or a nonvolatile memory device such as a flash memory.

The fingerprint recognition system 800 may include an interface 850 that becomes a data transmission path between the fingerprint recognition system 800 and another external device.

The interface 850 may be in a wired or wireless form. For example, the interface 850 may include an antenna, a wired/wireless transceiver, or the like. The fingerprint recognition system 800 may be used for an electronic device (not illustrated).

According to various embodiments of the disclosure, a fingerprint recognition package may include: a circuit board; an image sensor die attached and electrically connected to the circuit board; a light-shielding member applied to the circuit board; and an adhesive member attached to one side of the light-shielding member.

According to various embodiments of the disclosure, the light-shielding member may be UV-cured by being irradiated with ultraviolet rays.

According to various embodiments of the disclosure, the light-shielding member may be thermoset by being irradiated with heat.

According to various embodiments of the disclosure, ultraviolet-curing and thermosetting may be performed together on the light-shielding member.

According to various embodiments of the disclosure, the light-shielding member may be processed or removed using at least one of a laser or a router.

According to various embodiments of the disclosure, the light-shielding member may block 90% of light in a wavelength range of 400 to 700 nm.

According to various embodiments of the disclosure, the light-shielding member may include at least one of an ultraviolet-curable polymer or a thermosetting resin.

According to various embodiments of the disclosure, the light-shielding member may include at least one of urethane, acryl, or silicon.

According to various embodiments of the disclosure, the adhesive member may include at least one of a cohesion material layer or an adhesive layer.

According to various embodiments of the disclosure, an electronic device including a fingerprint recognition package may include a housing on which a display is mounted and a fingerprint recognition package included in the display. The fingerprint recognition package may include a circuit board, an image sensor die mounted on and electrically connected to the circuit board and configured to detect an image of a subject through a partial area of the display, a light-shielding member applied to the circuit board, and an adhesive member attached to one side of the light-shielding member.

According to various embodiments of the disclosure, the display may include a window, and the adhesive member may be attached to an inner surface of the window.

According to various embodiments of the disclosure, the image sensor die may further include an optical layer on one side thereof.

According to various embodiments of the disclosure, a method of manufacturing a fingerprint recognition package may include: an operation of attaching and electrically connecting an image sensor die to a circuit board; an operation of inverting the circuit board and the image sensor die and attaching a release film to face the image sensor die; an operation of applying a light-shielding member to an outer peripheral edge of the circuit board and attaching the light-shielding member to the image sensor die and the release film; an operation of irradiating the light-shielding member with ultraviolet rays so as to cure the light-shielding member; an operation of processing or removing a portion of the light-shielding member; an operation of removing the release film from the image sensor die; and an operation of attaching an adhesive member to one side of the light-shielding member.

According to various embodiments of the disclosure, the release film may include at least one of a transparent film, a translucent film, or glass.

According to various embodiments of the disclosure, the light-shielding member may be thermoset by being irradiated with heat.

According to various embodiments of the disclosure, the operation of processing or removing the light-shielding member is performed using at least one of a laser or a router.

According to various embodiments of the disclosure, the adhesive member may include at least one of a cohesion material layer or an adhesive layer.

According to various embodiments of the disclosure, the image sensor die may further include an optical layer thereon.

According to various embodiments of the disclosure, a method of manufacturing a fingerprint recognition package may include: an operation of attaching and electrically connecting an image sensor die to a circuit board; an operation of inverting the circuit board and the image sensor die and attaching a release film to face the image sensor die; an operation of applying a light-shielding member to an outer peripheral edge of the circuit board and attaching the light-shielding member to the image sensor die and the release film; an operation of irradiating the light-shielding member with ultraviolet rays so as to cure the light-shielding member; an operation of removing the release film from the image sensor die; and an operation of attaching an adhesive member to one side of the light-shielding member.

According to various embodiments of the disclosure, a method of manufacturing a fingerprint recognition package may include: an operation of attaching and electrically connecting an image sensor die to a circuit board; an operation of applying a light-shielding member to an outer peripheral edge of the image sensor die; an operation of attaching a release film to face the image sensor die; an operation of seating a mask on the release film; an operation of radiating ultraviolet rays to at least one guide hole formed in the mask to make the ultraviolet rays pass through the release film so as to cure the light-shielding member; an operation of removing the release film and the mask; and an operation of attaching an adhesive member to one side of the light-shielding member.

While the disclosure has been shown and described with reference to certain embodiments thereof, it will be apparent to those skilled in the art that the camera lens module according to the disclosure is not limited to these embodiments, and various changes in form and details may be made therein without departing from the spirit and scope of the disclosure as defined by the appended claims.

The invention claimed is:
1. A fingerprint recognition package comprising:
a circuit board;

an image sensor die attached and electrically connected to the circuit board;

a light-shielding member applied to the circuit board and to side edges of the image sensor die, the light-shielding member configured to seal a periphery of the image sensor die; and an adhesive member attached to one side of the light-shielding member, the adhesive member comprising a cohesion layer, wherein the fingerprint recognition package is configured to use a light source emitted from a display mounted outside the fingerprint recognition package, wherein the light source is reflected by a user fingerprint, and wherein the image sensor die is configured to detect an image of the user fingerprint.

2. The fingerprint recognition package of claim 1, wherein the light-shielding member is cured by being irradiated with ultraviolet rays.

3. The fingerprint recognition package of claim 2, wherein the light-shielding member is thermoset by being irradiated with heat.

4. The fingerprint recognition package of claim 3, wherein ultraviolet-curing and thermosetting are performed together on the light-shielding member.

5. The fingerprint recognition package of claim 1, wherein the light-shielding member is processed or removed using at least one of a laser or a router.

6. The fingerprint recognition package of claim 1, wherein the light-shielding member blocks 90% of light in a wavelength range of 400 to 700 nm.

7. The fingerprint recognition package of claim 1, wherein the light-shielding member includes at least one of an ultraviolet-curable polymer or a thermosetting resin.

8. The fingerprint recognition package of claim 1, wherein the adhesive member includes at least one of urethane, acryl, or silicon.

9. The fingerprint recognition package of claim 1, wherein the display includes a window, and the adhesive member is attached to an inner surface of the window.

10. The fingerprint recognition package of claim 1, wherein the image sensor die further includes an optical layer on one side thereof.

* * * * *